US006005949A

United States Patent [19]

Shimizu et al.

[11] Patent Number: 6,005,949

[45] Date of Patent: Dec. 21, 1999

[54] SURROUND SOUND EFFECT CONTROL DEVICE

[75] Inventors: Yoshikazu Shimizu; Satomi Nakagawa, both of Osaka, Japan

[73] Assignee: Matsushita Electric Industrial Co., Ltd., Osaka-fu, Japan

[21] Appl. No.: 08/101,673

[22] Filed: Aug. 4, 1993

Related U.S. Application Data

[63] Continuation of application No. 07/729,647, Jul. 15, 1991, abandoned.

[30] Foreign Application Priority Data

Jul. 17, 1990 [JP] Japan .................................... 2-187293

[51] Int. Cl.[6] ........................................ H03G 3/00

[52] U.S. Cl. ................................ 381/61; 381/63; 381/107

[58] Field of Search ................................ 381/61, 63, 107, 381/81, 123, 86, 1, 56, 62, 103, 85, 18

[56] References Cited

U.S. PATENT DOCUMENTS

| | | | |
|---|---|---|---|
| Re. 30,278 | 5/1980 | Stumpf et al. | 381/61 |
| 3,809,812 | 5/1974 | Smith, Sr. | 381/81 |
| 4,292,467 | 9/1981 | Odlen et al. | 381/1 |
| 4,363,001 | 12/1982 | Suzuki et al. | 381/107 |
| 4,559,867 | 12/1985 | Lutz | 381/107 |
| 4,569,268 | 2/1986 | Futamase et al. | 381/63 |
| 4,581,759 | 4/1986 | Takahashi | 381/56 |
| 4,628,789 | 12/1986 | Fujimori | 381/61 |
| 4,856,064 | 8/1989 | Iwamatsu . | |
| 5,027,687 | 7/1991 | Iwamatsu | 381/18 |
| 5,065,432 | 11/1991 | Sasaki et al. | 381/61 |
| 5,111,530 | 5/1992 | Kutaragi et al. | 381/63 |
| 5,123,051 | 6/1992 | Koinuma | 381/63 |

FOREIGN PATENT DOCUMENTS 0367569 10/1989 European Pat. Off. .

OTHER PUBLICATIONS

European Search Report for Application No. EP 89311250.
Japanese Patent Abstract Publication No. 62219900, by K. Mitsuhiro, “Automatic Surround Mode Controller”.
European Search Report and Communication with Annex Copy to Euro. Search Report.
JVC — RX–401BK (Instruction Booklet), Dec. 17, 1989.

*Primary Examiner*—Jack Chiang
*Attorney, Agent, or Firm*—Ratner & Prestia

[57] ABSTRACT

A surround sound effect control device includes a plurality of sound signal sources each for producing a sound signal, a sound source selection signal generator for generating a sound source selection signal indicative of one sound sources, and a plurality of surround effect circuits for modifying the sound signal. A memory is provided for storing data identifying one surround effect circuit correspondingly to each of the sound sources. A first switching arrangement is provided for selecting one of the plurality of sound sources in response to the sound source selection signal, and a second switching arrangement is provided for selecting one surround effect circuit in response to the data read from the memory.

8 Claims, 3 Drawing Sheets

| | |
|---|---|
| T V | MONAURAL SURROUND (3) |
| V 1 | DOLBY SURROUND (4) |
| V 2 | MUSIC SURROUND (5) |
| V 3 | MONAURAL SURROUND (3) |

SURROUND SOUND EFFECT CONTROL DEVICE

This application is a continuation of application Ser. No. 07/729,647 filed Jul. 15, 1991, now abandoned.

BACKGROUND OF THE INVENTION

1. Field of the Invention

The present invention relates to a surround sound effect control device for selecting one of a plurality of surround sound effect circuits and, more particularly, to a surround sound effect control device for use in a television set.

2. Description of the Prior Art

Conventionally, a surround sound effect control device is provided in the audio device to allow the user to vary the reproduced sound effect according to his desire.

An example of a conventional surround effect control device is shown in FIGS. 4. Reference numeral 1 is a sound signal source selection circuit for selecting a signal source from a plurality of signal sources TV, V1, V2, and V3 by a source switch SW1 in response to the sound signal selection signal SA. The selected signal S is transmitted through a line L1. The sound sources are, for example, a television set TV, a first video cassette recorder V1, a second video cassette recorder V2, and a third video cassette recorder V3.

Reference numeral 8 is a surround effect pattern selection circuit for selecting one of a plurality of surround sound effect patterns by surround switches SW2 and SW3 switched to one of surround effect circuits 3, 4, 5, 6, and 7 in response to a surround effect selection signal SS. Surround effect circuits 3, 4, 5, 6, and 7 can modify the sound signal S from line L1 to various signal patterns of surround sound effect, such as "Dolby (Trade Mark) Surround", "Movie Surround", "Music Surround", "Monaural Surround", and "Surround-off". The modified sound signal S' is output through a line L2.

Each of surround sound effect circuits 3, 4, 5, 6 and 7 is briefly described as follows.

The dolby surround circuit 3 reproduces a sound from a sound signal including a delay between left and right sound signals.

The movie surround circuit 4 reproduces a sound by the delay of a difference signal between left and right sound signals.

The music surround circuit 5 reproduces a sound in a manner similar to that of the movie surround circuit 4, but the amount of the delay is reduced.

The monaural surround circuit 6 generates the difference signal from the original sound signal and a delayed signal thereof.

In operation, when the sound selection signal SA is input to the sound source selection circuit 1, the selection switch SW1 turns to connect one of the sound signal sources TV, V1, V2, and V3 to line L1. For example, it is assumed that the switch SW1 is turned such that the sound source V1 is connected to line L1, as depicted in FIG. 4 by the input signal SA.

When the surround effect selection signal SS is input to a surround effect pattern selection circuit 8, the surround switches SW2 and SW3 are turned to connect line L1 to one of surround effect pattern circuits 3, 4, 5, 6, and 7 and further to line L2. For example, it is assumed that the switches SW2 and SW3 are turned such that lines L1 and L2 are connected through the movie surround circuit 4 by the surround effect selection signal SS.

In this case, the sound signal S from the first video cassette recorder V1 is input to the movie surround circuit 4 in which the original sound signal S is modified to signal S'. The modified signal S', thus obtained, is further transmitted to a next stage through line L2.

However, according to the prior art surround sound effect control device, the selection of sound signal sources TV, V1, V2, and V3 and the selection of surround effect pattern circuits 3, 4, 5, 6, and 7 are performed individually, without any mutual relationship. Thus, it is necessary for the user to make two selections, one for the sound signal source and the other for surround sound effect pattern, every time when the viewing source is changed. For example, while watching a TV program which is usually served in a monaural sound, if a user switches to a video cassette recorder, associated with the sound signal source V1, it is necessary to further turn the switches SW2 and SW3 from the "Monaural Surround" to a position other than the "Monaural Surround" so that the stereo sound as usually served by the video cassette tape can be appreciated with its full performance.

SUMMARY OF THE INVENTION

The present invention has been developed with a view to substantially solving the above described disadvantages and has for its essential object to provide an improved surround sound effect control device.

In order to achieve the aforementioned objective, a surround sound effect control device comprises a plurality of sound signal sources each for producing a sound signal, a sound source selection signal generating means for generating a sound source selection signal indicative of one of the plurality of sound sources, and a plurality of sound signal modifying means for modifying the sound signal. The surround sound effect control device further comprises a memory means for storing data identifying one of the plurality of sound signal modifying means correspondingly to each of the sound sources, a first switching means for selecting one of the plurality of sound sources in response to the sound source selection signal, and a second switching means for selecting one of the plurality of sound signal modifying means in response to data read from the memory means.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

Figure 1:
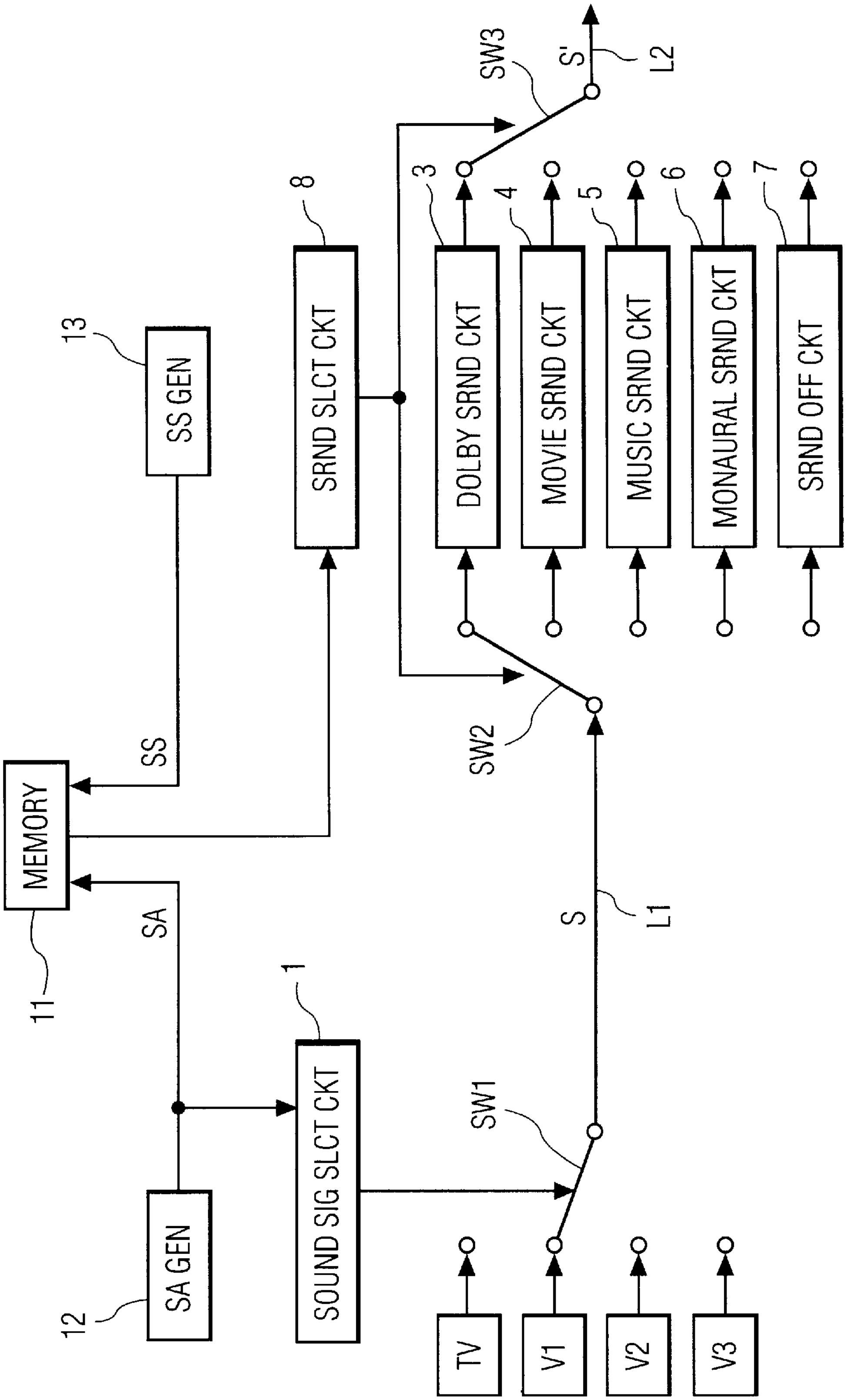
FIG. 1 is a block diagram of a surround sound effect control device according to a preferred embodiment of the present invention.

Referring to FIG. 1, a surround sound effect control device according to an embodiment of the present invention is shown.

In FIG. 1, reference numeral 1 is a sound signal source selection circuit for selecting a signal source from a plurality of signal sources TV, V1, V2, and V3 by a source switch SW1 in response to the sound signal selection signal SA. The selected signal S is transmitted through a line L1. The sound sources are, for example, a television set TV, a first video cassette recorder V1, a second video cassette recorder V2, and a third video cassette recorder V3.

Reference numeral 8 is a surround effect pattern selection circuit for selecting one of a plurality of surround sound effect patterns by surround switches SW2 and SW3 switched to one of surround effect circuits 3, 4, 5, 6, and 7. Surround effect circuits 3, 4, 5, 6, and 7 can modify the sound signal S from line L1 to various signal patterns of surround sound effect, such as "Dolby (Trade Mark) Surround", "Movie Surround", "Music Surround", "Monaural Surround", and "Surround-off". The modified sound signal S' is output through a line L2.

The surround sound effect control device according to the embodiment of the present invention further comprises a memory 11 for storing a table carrying a number of different sound sources and corresponding pattern numbers identifying different surround sound effect.

Figures 2, 3:
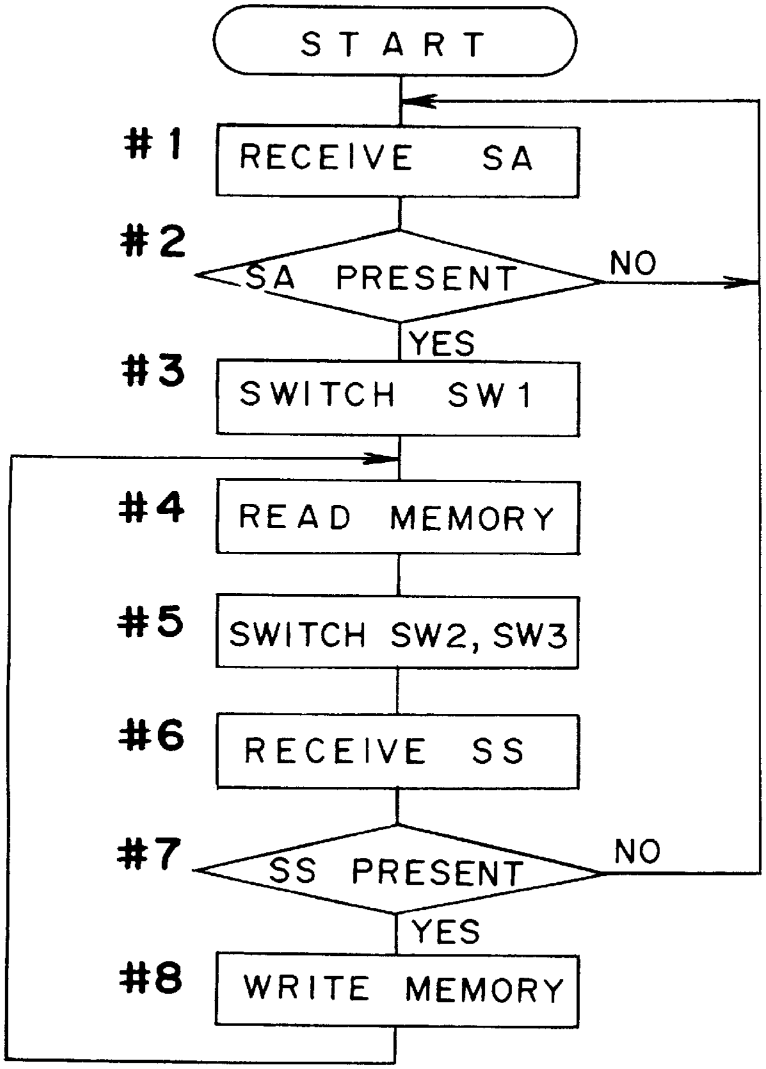
FIG. 2 is a table showing a relationship between a sound signal source, and a surround sound effect pattern stored in a memory device provided in the surround sound effect control device of FIG. 1.
FIG. 3 is a flow chart showing an operation of the surround sound effect device of FIG. 1.
Figure 4:
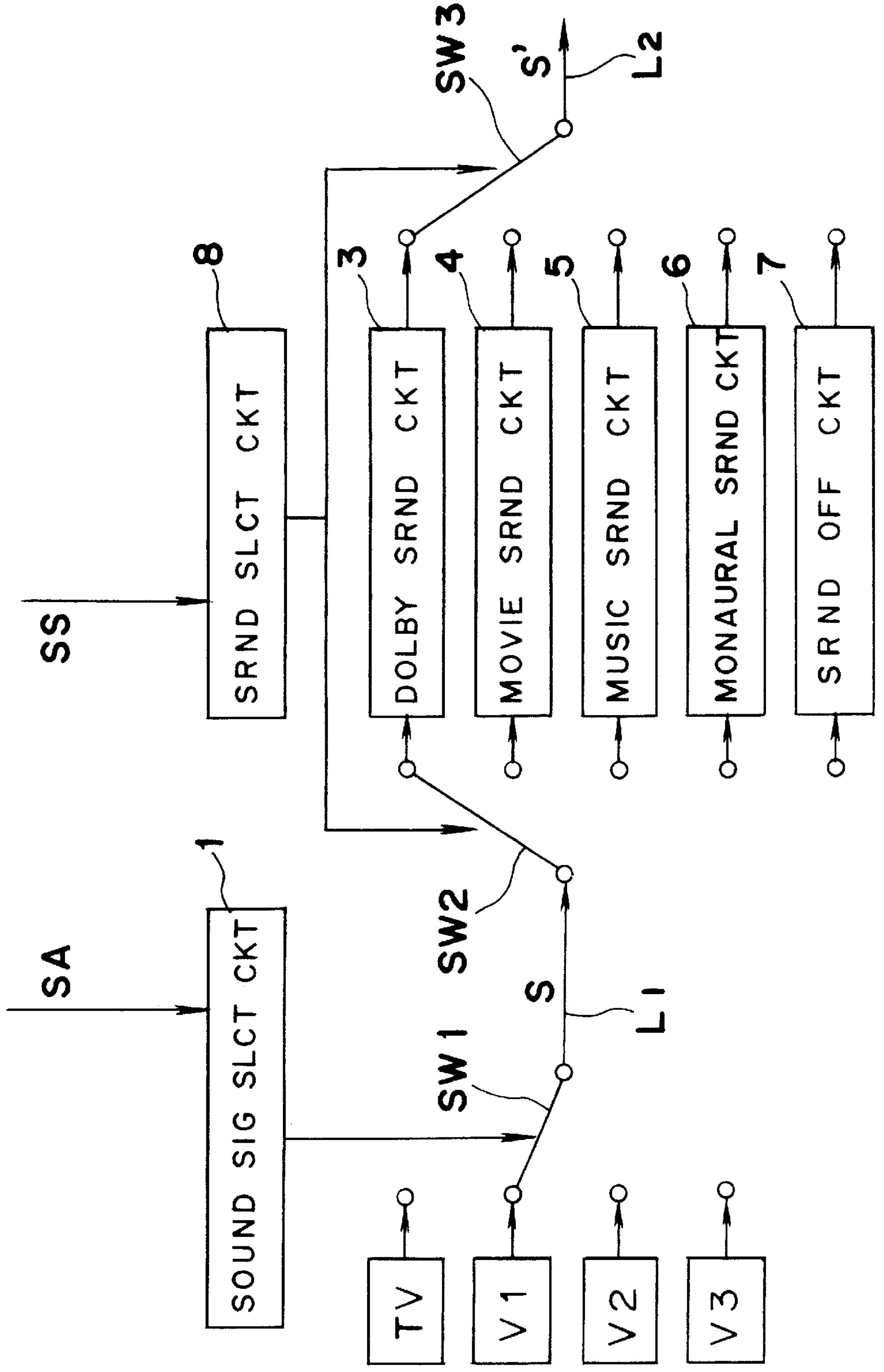
Fig. 4 PRIOR ART
FIG. 4 is a block diagram of a conventional surround sound effect control device.

Referring to FIG. 2, an example such a table stored in memory 11 is shown. In the table of FIG. 2, the sound signal sources are shown in the left column and the surround sound effect patterns with surround circuit numbers are shown in the right column. The sound signal sources and the surround sound effect patterns are stored in pairs to set desired combinations, and such combinations can be set by the user. For example, for the sound signal source TV, "MONAURAL SURROUND" is paired, and thus the surround circuit number "6" is assigned.

Referring back to FIG. 1, the memory 11 is coupled with a sound selection signal generator 12 and a surround selection signal generator 13. The sound selection signal generator 12 repeatedly or continuously generates the sound selection signal SA identifying the sound source which the user selects. For example, when the sound signal source TV is selected by a suitable selection key, such as provided in a remote controller (not shown), a sound selection signal SA representing the TV is produced not only at the time when the selection is made, but during the entire period while the sound signal source TV is selected.

The surround selection signal generator 13, on the other hand, generates one shot of a surround selection signal SS in response to each selection of surround sound effect pattern by a suitable selection key (not shown).

When the surround selection signal SS carrying an information of surround sound effect pattern which is newly selected by the user is input to the memory 11, the surround sound effect patterns for the current sound source stored in the memory 11 is rewritten by the newly selected surround sound effect pattern. When the data in the table is renewed, the surround switches SW2 and SW3 turn to connect the lines L1 and L2 to the newly selected surround circuit.

For example, it is assumed that the sound signal source V2 is currently selected, the sound selection signal generator 12 continuously generates the sound selection signal SA which identifies the second video recorder V2. The sound selection signal SA is input to the sound signal selection circuit 1 which thereupon turns and holds the sound switch S1 to connect the line 1 to the sound source V2. In the mean time, the sound selection signal SA is also input to the memory 11 for reading the data paired with the received sound selection signal SA, which is "Music Surround (2)" according to the table in FIG. 2.

Then, when the user newly selects one of surround effect patterns such as "Dolby Surround (3)" through a suitable key (not shown), the surround selection signal generator 13 generates a surround selection signal SS identifying "Dolby Surround (3)". The surround selection signal SS is then applied to the memory 11 and is rewritten in the memory 11. Thus the data in memory 11 at the area corresponding to the presently selected signal source is rewritten, e.g. from "Music Surround (2)" to "Dolby Surround (3)" in the above example. Thus obtained data identifying "Dolby Surround (3)" is applied to the surround selection circuit 8, which then drives the surround switches SW2 and SW3 to connect the lines L1 and L2 to the dolby surround 3.

As described above, according to the present invention, a desired surround sound effect pattern for each sound source can be stored in the memory 11 through a simple operation.

Referring to FIG. 3, a flow chart of operation executed in the surround sound effect control device according to the present invention is shown.

As shown at step #1, the system including memory 11 is set in a condition ready to receive from source selection signal generator 12 a sound signal selection signal SA which represents one of signal sources TV, V1, V2 and V3.

At step #2, the presence of the sound signal selection signal SA is detected. When the sound selection signal SA is not present, the operation returns to step #1. When the sound selection signal SA is present, the operation goes to step #3.

At step #3, in response to the detection of the sound signal selection signal SA, the sound signal selection circuit 1 is activated so that the source switch SW1 is turned to connect one of signal sources TV, V1, V2, and V3 to the line L1.

At step #4, the sound selection signal SA is input to the memory 11 to designate a particular area in the memory 11 at which the surround sound effect pattern, such as the surround circuit number, is stored, and in turn, the data in the designated area is read out.

At step #5, the surround switches SW2 and SW3 are turned by the surround selection circuit 8 to connect one of surround circuits 3, 4, 5, 6, and 7 to the lines L1 and L2 in response to the surround circuit number read out from the memory 11.

At step #6, the system is set in a condition ready to receive from the surround selection signal generate 13 the surround selection signal SS which represents one of surround sound effect pattern selected by the user.

At step #7, the presence of the surround selection signal SS is detected. When the surround selection signal SS is not present, the operation returns to step #1. When the sound selection signal SS is present, the operation goes to step #8.

At step #8, the surround selection signal SS is input to the memory 11 and is used for overwriting the surround sound effect pattern data at the area corresponding to the currently selected sound signal source.

Thereafter, the operation returns to step #4 and follows steps #5, #6, and #7, and further to step #1, provided that no more surround selection signal SS is present.

From the above, it is clear that surround sound effect pattern is automatically selected based on the data stored in the memory 11, every time when the user changes the sound signal source.

Thus, the surround sound effect control device according to the present invention can release the user from such a bothersome task to re-select a favorable surround effect pattern for each of the sound sources. Furthermore, when the user desires to change the surround effect set to the current sound source, the user can easily change the same to a new surround effect pattern.

What is claimed is:

1. A surround sound effect control device, comprising:

a plurality of sound signal sources each for producing a respective sound signal;

a sound source selection signal generating means for generating a sound source selection signal indicative of one of said plurality of sound sources;

a sound signal selecting circuit, coupled to said sound source selection signal generating means, for selecting one of said plurality of sound sources in response to said sound source selection signal;

sound signal modifying means, including a plurality of sound signal circuits, wherein said sound signal is modifiable by any one of said plurality of sound circuits;

memory means, independent and distinct from any of said plurality of sound signal sources, for storing a first data value which identifies one of said plurality of sound signal circuits correspondingly to one of said plurality of sound sources which has been selected, and, while said one of said plurality of sound sources continues to be selected, for then storing a second data value which identifies another of said plurality of sound signal circuits correspondingly to said one of said plurality of sound sources, wherein said first data value and said second data value are each stored in said memory means responsive to said one and said another of said plurality of sound circuits being respectively selected;

a surround selecting circuit for selecting one of said plurality of sound signal circuits in response to a respective one of said plurality of data values read from said memory means;

first switching means for selecting one of said plurality of sound sources in response to said sound signal selecting circuit; and second switching means for selecting one of said plurality of sound signal circuits in response to said surround selecting circuit;

said sound source selection signal being transmitted to a) said memory means to select one of said plurality of data values and b) to said sound signal selecting circuit to control said first switching means.

2. A surround sound effect control device as claimed in claim 1, further comprising surround selection signal generating means for generating a modify selection signal identifying one of said plurality of sound signal modifying means, said modify selection signal being stored in said memory means correspondingly to a previously selected sound source.

3. A surround sound effect control device as claimed in claim 1, wherein said sound source selection signal generating means continuously produces said sound source selection signal.

4. A surround sound effect control device as claimed in claim 1, wherein the sound source selection signal is transmitted to said memory means during memory storage and simultaneously is transmitted to said sound signal selecting circuit to control said first switching means.

5. A surround sound effect control device according to claim 1, wherein, while said first data value and then said second data value are stored in said memory means, a listener listens to said any one of said plurality of sound sources which has been selected and through said one of said plurality of sound signal circuits, said listener then listens to said any one of said plurality of sound sources through said another of said plurality of sound signal circuits without any of said plurality of sound sources starting to be selected between said one and said another of said plurality of sound circuits being selected.

6. A method of assigning one of a plurality of sound circuits to one of a plurality of sound sources, said method comprising the steps of;

(a) selecting said one of said plurality of sound sources;

(b) selecting another of said plurality of sound circuits;

(c) storing in a memory a first data value corresponding to said selected another one of said sound circuits;

(d) allowing said selected sound source modified by said selected another of said sound circuits to be heard by a user;

(e) selecting said one of said plurality of sound circuits while said sound source selected in step a) continues to be selected;

(f) storing in said memory a second data value corresponding to said selected sound circuit selected in step e); and (g) allowing said selected sound source modified by said selected sound circuit to be heard by said user.

7. A method of assigning one of a plurality of sound circuits according to claim 6, wherein between step (d) and step (g), none of said plurality of sound circuits start to be selected.

8. A surround sound effect control device according to claim 1, wherein a user is allowed to bear said one of said plurality of sound sources first modified by said one of said plurality of sound signal circuits and then modified by said another of said plurality of sound signal circuits as said one and said another of said plurality of sound signal circuits are selected, respectively.

* * * * *